United States Patent
Tanaka et al.

(10) Patent No.: US 8,343,306 B2
(45) Date of Patent: Jan. 1, 2013

(54) PLASMA PROCESSING APPARATUS AND METHOD OF PLASMA DISTRIBUTION CORRECTION

(75) Inventors: Satoshi Tanaka, Nirasaki (JP); Chishio Koshimizu, Nirasaki (JP); Manabu Iwata, Nirasaki (JP); Naoki Matsumoto, Amagasaki (JP); Toru Ito, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1017 days.

(21) Appl. No.: 12/046,094

(22) Filed: Mar. 11, 2008

(65) Prior Publication Data

US 2009/0026170 A1    Jan. 29, 2009

Related U.S. Application Data

(60) Provisional application No. 60/916,319, filed on May 7, 2007.

(30) Foreign Application Priority Data

Mar. 12, 2007   (JP) ................................. 2007-061748

(51) Int. Cl.
*H01L 21/00* (2006.01)
*C23C 16/00* (2006.01)

(52) U.S. Cl. ......... 156/345.28; 156/345.24; 156/345.25; 118/712; 118/715; 118/723 R

(58) Field of Classification Search ............. 156/345.51, 156/345.24, 345.27, 915
See application file for complete search history.

(56) References Cited

U.S. PATENT DOCUMENTS

| | | | |
|---|---|---|---|
| 6,265,831 B1 * | 7/2001 | Howald et al. ........... 315/111.21 |
| 7,572,737 B1 * | 8/2009 | Dhindsa ........................ 438/714 |
| 2001/0009139 A1 * | 7/2001 | Shan et al. ................. 118/723 E |
| 2004/0125360 A1 * | 7/2004 | Ludviksson et al. ............ 356/72 |
| 2005/0095732 A1 * | 5/2005 | Maebashi et al. ............... 438/17 |
| 2005/0103275 A1 * | 5/2005 | Sasaki et al. .................. 118/728 |
| 2007/0037300 A1 * | 2/2007 | Qin et al. ........................ 438/14 |
| 2007/0224709 A1 * | 9/2007 | Ogasawara ....................... 438/5 |

FOREIGN PATENT DOCUMENTS

| | | | |
|---|---|---|---|
| JP | 61179539 A | * | 8/1986 |
| JP | 7-211705 | | 8/1995 |
| JP | 8-167588 | | 6/1996 |
| JP | 2001-60557 | | 3/2001 |
| JP | 2004-260159 | | 9/2004 |
| JP | 2006-173223 | | 6/2006 |
| JP | 2006-216605 | | 8/2006 |

OTHER PUBLICATIONS

Japanese Office Action issued Jun. 21, 2011, in Patent Application No. 2007-061748 (with English-language translation).

* cited by examiner

*Primary Examiner* — Ram N. Kackar
(74) *Attorney, Agent, or Firm* — Oblon, Spivak, McClelland, Maier & Neustadt, L.L.P.

(57) ABSTRACT

A plasma processing apparatus can prevent a sheath from becoming distorted, simplify a configuration of the apparatus, and prevent particles from attaching to a substrate. The plasma processing apparatus performs plasma processing on the substrate. A housing chamber houses the substrate. A mounting stage is disposed within the housing chamber and mounted with the substrate. An annular member is disposed in the mounting stage. A power supply unit supplies high-frequency power to the mounting stage. An observation unit optically observes the distribution of the plasma. A voltage applying unit applies a DC voltage to the annular member. A control unit sets the value of the DC voltage to be applied based on the observed plasma distribution.

5 Claims, 11 Drawing Sheets

PLASMA PROCESSING APPARATUS AND METHOD OF PLASMA DISTRIBUTION CORRECTION

BACKGROUND OF THE INVENTION

1. Field of the Invention

The present invention relates to a plasma processing apparatus and a method of plasma distribution correction and, more particularly, to a plasma processing apparatus having a focus ring.

2. Description of the Related Art

A plasma processing apparatus for performing a plasma processing on a wafer serving as a substrate using plasma is provided with a housing chamber (chamber) for housing wafers, a mounting stage disposed within the chamber to be mounted with a wafer, and a focus ring disposed on the mounting stage so as to surround the wafer. The focus ring is made of silicon and converges ions in plasma within the chamber onto the wafer, in order to improve the efficiency of a plasma processing, for example, an etching processing, to be performed on the wafer.

In addition, as shown in FIG. 11A, a focus ring 110 maintains a potential difference between the focus ring 110 and plasma 111 the same as a potential difference between a wafer W and the plasma 111. Thus, a sheath 112 formed between the wafer W (or focus ring 110) and the plasma 111 is kept level. As a result, all of ions 113 passing through the sheath 112 almost perpendicularly enter the wafer W, thereby forming vertical trenches and holes across the wafer W.

However, since the focus ring 110 is made of silicon and is therefore abraded by plasma, the upper surface of the focus ring 110 may become lower than the surface of the wafer W. At this time, the plasma 111 facing the upper surface of the focus ring 110 is displaced (lowers) according to the lowering of the upper surface. Consequently, the sheath 112 may become distorted around the peripheral part of the wafer W (see FIG. 11B). Ions 113 having passed through the distorted sheath 112 obliquely enter the peripheral part of the wafer W, thereby forming trenches and holes at a tilt. In addition, since some ions 113 obliquely enter the wafer W, the density of ion entry across the wafer W is no longer constant. As a result, an etch rate becomes uneven across the wafer W.

Hence, there has heretofore been developed a plasma etching apparatus for preventing sheath distortion by mechanically raising a worn focus ring (see, for example, Japanese Patent Laid-Open No. 2006-173223). This apparatus measures the upper surface position of the focus ring using laser light to determine the amount of wear in the focus ring, thereby adjusting the upper surface position of the focus ring based on the amount of wear.

However, the above-described apparatus requires a drive unit having a shaft and a motor in order to mechanically raise the focus ring, thus giving rise to the problem that the configuration thereof becomes complicated. The apparatus has another problem that when the focus ring moves, deposits adhering thereto separate on impact of the movement and fly apart in particles, thus attaching to a wafer.

SUMMARY OF THE INVENTION

The present invention provides a plasma processing apparatus and a method of plasma distribution correction whereby a sheath can be prevented from becoming distorted, the configuration of the apparatus can be simplified, and particles can be prevented from attaching to a substrate.

Accordingly, in a first aspect of the present invention, there is provided a plasma processing apparatus provided with a housing chamber adapted to house a substrate, a mounting stage disposed within the housing chamber and mounted with the substrate, an annular member disposed in the mounting stage so as to surround the periphery of the mounted substrate, and a power supply unit adapted to supply high-frequency power to the mounting stage, and configured to perform a plasma processing on the substrate using plasma produced within the housing chamber, the plasma processing apparatus comprising an observation unit adapted to optically observe the distribution of the plasma, a voltage applying unit adapted to apply a DC voltage to the annular member, and a control unit adapted to set the value of the DC voltage to be applied based on the observed plasma distribution.

According to the first aspect of the present invention, the distribution of plasma produced in the housing chamber is optically observed, the value of a DC voltage to be applied to the annular member is set based on the observed plasma distribution, and the DC voltage is applied to the annular member. When the DC voltage is applied to the annular member, a potential difference between the plasma and the annular member varies and, therefore, a distance from the annular member to the plasma varies. Consequently, it is possible to prevent the plasma from being displaced due to wear in the annular member and thus prevent a sheath from becoming distorted. In addition, since the sheath can be prevented from becoming distorted simply by applying a DC voltage to the annular member, it is possible to simplify the configuration of the plasma processing apparatus. Furthermore, since there is no need to move the annular member, deposits do not separate therefrom. As a result, it is possible to prevent particles from attaching to a substrate. Still furthermore, since a plasma distribution is optically observed, it is possible to know the plasma distribution more precisely than when the plasma distribution is observed indirectly. As a result, it is possible to make the value of a DC voltage to be applied even more appropriate.

The first aspect of the present invention can provide a plasma processing apparatus, wherein the control unit changes the value of high-frequency power to be supplied to the mounting stage when a DC voltage is applied to the annular member.

According to the first aspect of the present invention, the value of high-frequency power to be applied to the mounting stage is changed when a DC voltage is applied to the annular member. When a negative DC voltage is applied to the annular member, the plasma is pushed up and a distance between the annular member and the plasma thus increases. Consequently, a capacitance (C) formed between the annular member and the plasma decreases, making it difficult for a high-frequency current to pass through a space between the annular member and the plasma. As a result, the plasma converges on the substrate and a plasma density above the substrate, particularly above the central part thereof, becomes higher, thereby increasing an etch rate at the central part of the substrate. By changing the value of high-frequency power being applied to the mounting stage to be mounted with the substrate, it is possible to reduce the plasma density above the central part of the substrate. Thus, it is possible to prevent the etch rate from becoming higher at the central part of the substrate.

The first aspect of the present invention can provide a plasma processing apparatus, wherein the control unit sets the value of the DC voltage to be applied, so as to increase a potential difference between the annular member and the plasma.

According to the first aspect of the present invention, the value of a DC voltage to be applied is set so as to increase a potential difference between the annular member and the plasma. When the potential difference between the plasma and the annular member becomes larger, the distance from the annular member to the plasma increases, thereby allowing the plasma to be pushed up reliably. Consequently, it is possible to reliably prevent the plasma from lowering due to wear in the annular member and the sheath from becoming distorted.

The first aspect of the present invention can provide a plasma processing apparatus, wherein the power supply unit is connected to the mounting stage through a power supply rod and the voltage applying unit applies the DC voltage to the annular member through the power supply rod and the mounting stage.

According to the first aspect of the present invention, a DC voltage is applied to the annular member through a power supply rod and the mounting stage. That is, the DC voltage can be applied to the annular member simply by connecting a voltage applying unit to the power supply rod. Thus, it is possible to further simplify the configuration of the plasma processing apparatus.

The first aspect of the present invention can provide a plasma processing apparatus, wherein the voltage applying unit includes a conductive wire in contact with the annular member and applies the DC voltage to the annular member through the conductive wire.

According to the first aspect of the present invention, since a DC voltage is applied to the annular member through conductive wires, it is possible to reliably apply the DC voltage to the annular member. In addition, since the DC voltage is not applied to any other components of the plasma processing apparatus, it is possible to eliminate the possibility of exerting an adverse effect on plasma processing.

The first aspect of the present invention can provide a plasma processing apparatus, wherein the observation unit is a CCD camera.

According to the first aspect of the present invention, since the observation unit is a CCD camera, it is possible to optically observe the plasma distribution in a reliable manner. In addition, since the CCD camera is easily available, it is possible to easily materialize the observation unit.

Accordingly, in a second aspect of the present invention, there is provided a plasma processing apparatus provided with a housing chamber adapted to house a substrate, a mounting stage disposed within the housing chamber and mounted with the substrate, an annular member disposed in the mounting stage so as to surround the periphery of the mounted substrate, and a power supply unit adapted to supply high-frequency power to the mounting stage, the configured to perform a plasma processing on the substrate using plasma produced within the housing chamber, the plasma processing apparatus comprising a wear measurement unit adapted to measure the amount of wear in the annular member based on the reflected light of laser light irradiated at the annular member, a voltage applying unit adapted to apply a DC voltage to the annular member, and a control unit adapted to set the value of the DC voltage to be applied based on the measured amount of wear in the annular member.

According to the second aspect of the present invention, the amount of wear in the annular member is measured based on the reflected light of laser light irradiated at the annular member, the value of a DC voltage to be applied to the annular member is set based on the measured amount of wear in the annular member, and the DC voltage is applied to the annular member. When the DC voltage is applied to the annular member, a potential difference between plasma and the annular member varies and, therefore, a distance from the annular member to the plasma also varies. Consequently, it is possible to prevent the plasma from being displaced due to wear in the annular member and the sheath from becoming distorted. In addition, since the sheath can be prevented from becoming distorted simply by applying a DC voltage to the annular member, it is possible to simplify the configuration of the plasma processing apparatus. Furthermore, since there is no need to move the annular member, deposits do not separate therefrom. As a result, it is possible to prevent particles from attaching to the substrate. Still furthermore, since the amount of wear in the annular member is measured based on the reflected light of laser light, there is no need to bring a probe or the like into contact with the annular member in order to measure the amount of wear. That is, it is possible to eliminate the need to stop the operation of the plasma processing apparatus in order to bring the probe or the like into the housing chamber. Thus, it is possible to improve the operating rate of the plasma processing apparatus.

The second aspect of the present invention can provide a plasma processing apparatus, wherein the control unit changes the value of high-frequency power to be supplied to the mounting stage when a DC voltage is applied to the annular member.

Accordingly, in a third aspect of the present invention, there is provided a plasma processing apparatus provided with a housing chamber adapted to house a substrate, a mounting stage disposed within the housing chamber and mounted with the substrate, an annular member disposed in the mounting stage so as to surround the periphery of the mounted substrate, and a power supply unit adapted to supply high-frequency power to the mounting stage, and configured to perform a plasma processing on the substrate using plasma produced within the housing chamber, the plasma processing apparatus comprising a voltage applying unit adapted to apply a DC voltage to the annular member, and a control unit adapted to predict the amount of wear in the annular member based on the conditions of the plasma processing and the execution time thereof, wherein the control unit sets the value of the DC voltage to be applied based on the predicted amount of wear in the annular member.

According to the third aspect of the present invention, the amount of wear in the annular member is estimated based on the conditions of a plasma processing and the execution time thereof, the value of a DC voltage to be applied to the annular member is set based on the estimated amount of wear in the annular member, and the DC voltage is applied to the annular member. When the DC voltage is applied to the annular member, a potential difference between plasma and the annular member varies and, therefore, a distance from the annular member to the plasma also varies. Consequently, it is possible to prevent the plasma from being displaced due to wear in the annular member and the sheath from becoming distorted. In addition, since the sheath can be prevented from becoming distorted simply by applying a DC voltage to the annular member, it is possible to simplify the configuration of the plasma processing apparatus. Furthermore, since there is no need to move the annular member, deposits do not separate therefrom. As a result, it is possible to prevent particles from attaching to the substrate. Still furthermore, since the amount of wear in the annular member is estimated based on the conditions of a plasma processing and the execution time thereof, there is no need for either a unit for observing a plasma distribution or a unit for measuring the amount of wear in the annular member. This means that there is, at worst, only the need for sensors for measuring a temperature, a pressure and the like within the housing chamber. Accordingly, it is possible to further simplify the configuration of the plasma processing apparatus.

The third aspect of the present invention can provide a plasma processing apparatus, wherein the control unit changes the value of high-frequency power to be supplied to the mounting stage when a DC voltage is applied to the annular member.

Accordingly, in a fourth aspect of the present invention, there is provided a method of plasma distribution correction in a plasma processing apparatus provided with a housing chamber adapted to house a substrate, a mounting stage disposed within the housing chamber and mounted with the substrate, an annular member disposed in the mounting stage so as to surround the periphery of the mounted substrate, and a power supply unit adapted to supply high-frequency power to the mounting stage, and configured to perform a plasma processing on the substrate using plasma produced within the housing chamber, the method of plasma distribution correction comprising an observation step of optically observing the distribution of the plasma, a voltage setting step of setting the value of a DC voltage to be applied to the annular member based on the observed plasma distribution, and a voltage application step of applying the DC voltage to the annular member.

According to the fourth aspect of the present invention, the distribution of plasma produced in the housing chamber is optically observed, the value of a DC voltage to be applied to the annular member is set based on the observed plasma distribution, and the DC voltage is applied to the annular member. When the DC voltage is applied to the annular member, a potential difference between the plasma and the annular member varies and, therefore, a distance from the annular member to the plasma also varies. Consequently, it is possible to prevent the plasma from being displaced due to wear in the annular member and the sheath from becoming distorted. In addition, since the sheath can be prevented from becoming distorted simply by applying a DC voltage to the annular member, it is possible to simplify the configuration of the plasma processing apparatus. Furthermore, since there is no need to move the annular member, deposits do not separate therefrom. As a result, it is possible to prevent particles from attaching to the substrate. Still furthermore, since a plasma distribution is optically observed, it is possible to know the plasma distribution more precisely than when the plasma distribution is observed indirectly. As a result, it is possible to make the value of a DC voltage to be applied even more appropriate.

Accordingly, in a fifth aspect of the present invention, there is provided a method of plasma distribution correction in a plasma processing apparatus provided with a housing chamber adapted to house a substrate, a mounting stage disposed within the housing chamber and mounted with the substrate, an annular member disposed in the mounting stage so as to surround the periphery of the mounted substrate, and a power supply unit adapted to supply high-frequency power to the mounting stage, and configured to perform a plasma processing on the substrate using plasma produced within the housing chamber, the method of plasma distribution correction comprising a wear measurement step of measuring the amount of wear in the annular member based on the reflected light of laser light irradiated at the annular member a voltage setting step of setting the value of a DC voltage to be applied to the annular member based on the measured amount of wear in the annular member, and a voltage application step of applying the DC voltage to the annular member.

According to the fifth aspect of the present invention, the amount of wear in the annular member is measured based on the reflected light of laser light irradiated at the annular member, the value of a DC voltage to be applied to the annular member is set based on the measured amount of wear in the annular member, and the DC voltage is applied to the annular member. When the DC voltage is applied to the annular member, a potential difference between plasma and the annular member varies and, therefore, a distance from the annular member to the plasma also varies. Consequently, it is possible to prevent the plasma from being displaced due to wear in the annular member and the sheath from becoming distorted. In addition, since the sheath can be prevented from becoming distorted simply by applying a DC voltage to the annular member, it is possible to simplify the configuration of the plasma processing apparatus. Furthermore, since there is no need to move the annular member, deposits do not separate therefrom. As a result, it is possible to prevent particles from attaching to the substrate. Still furthermore, since the amount of wear in the annular member is measured based on the reflected light of laser light, there is no need to bring a probe or the like into contact with the annular member in order to measure the amount of wear. That is, it is possible to eliminate the need to stop the operation of the plasma processing apparatus in order to bring the probe or the like into the housing chamber. Thus, it is possible to improve the operating rate of the plasma processing apparatus.

The fifth aspect of the present invention can provide a method of plasma distribution correction, further including a temperature control step of adjusting the temperature of the annular member to a steady value prior to the wear measurement step.

According to the fifth aspect of the present invention, the temperature of the annular member is controlled to a steady value prior to measuring the amount of wear in the annular member. When the amount of wear in the annular member is measured based on the reflected light of laser light, the amount of wear is calculated based on a difference in the optical path length of the reflected light in the annular member. However, the optical path length difference varies depending on the temperature of the annular member. Accordingly, by adjusting the temperature of the annular member to a steady value, it is possible to determine the optical path length difference of the reflected light in the annular member. Thus, it is possible to precisely measure the amount of wear in the annular member.

Accordingly, in a sixth aspect of the present invention, there is provided a method of plasma distribution correction in a plasma processing apparatus provided with a housing chamber adapted to house a substrate, a mounting stage disposed within the housing chamber and mounted with the substrate, an annular member disposed in the mounting stage so as to surround the periphery of the mounted substrate, and a power supply unit adapted to supply high-frequency power to the mounting stage, and configured to perform a plasma processing on the substrate using plasma produced within the housing chamber, the method of plasma distribution correction comprising a wear prediction step of predicting the amount of wear in the annular member based on the conditions of the plasma processing and the execution time thereof, a voltage setting step of setting the value of a DC voltage to be applied to the annular member based on the predicted amount of wear in the annular member, and a voltage application step of applying the DC voltage to the annular member.

According to the sixth aspect of the present invention, the amount of wear in the annular member is estimated based on the conditions of a plasma processing and the execution time thereof, the value of a DC voltage to be applied to the annular member is set based on the estimated amount of wear in the annular member, and the DC voltage is applied to the annular member. When the DC voltage is applied to the annular member, a potential difference between plasma and the annular member varies and, therefore, a distance from the annular member to the plasma also varies. Consequently, it is possible to prevent the plasma from being displaced due to wear in the annular member and the sheath from becoming distorted. In addition, since the sheath can be prevented from becoming distorted simply by applying a DC voltage to the annular member, it is possible to simplify the configuration of the plasma processing apparatus. Furthermore, since there is no need to move the annular member, deposits do not separate therefrom. As a result, it is possible to prevent particles from attaching to the substrate. Still furthermore, since the amount of wear in the annular member is estimated based on the conditions of a plasma processing and the execution time thereof, there is no need for either a unit for observing a plasma distribution or a unit for measuring the amount of wear in the annular member. This means that there is, at worst, only the need for sensors for measuring a temperature, a pressure and the like within the housing chamber. Accordingly, it is possible to further simplify the configuration of the plasma processing apparatus.

The features and advantages of the invention will become more apparent from the following detailed description taken in conjunction with the accompanying drawings.

BRIEF DESCRIPTION OF THE DRAWINGS

FIGS. 9A and 9B are graphical views showing databases stored by the controller illustrated in FIG. 8, wherein FIG. 9A represents a database showing the relationship between the supply time of high-frequency power and the thickness of a focus ring and FIG. 9B represents a database showing the relationship between the supplied value of high-frequency power and the wear rate of the focus ring.

FIGS. 11A and 11B are schematic views illustrating the relationship between the wear of a focus ring and the position of plasma, wherein FIG. 11A shows a case where the focus ring is not worn and FIG. 11B shows a case where the focus ring is worn.

DETAILED DESCRIPTION OF THE PREFERRED EMBODIMENTS

Hereinafter, embodiments of the present invention will be described with reference to the accompanying drawings.

First, an explanation will be made of a plasma processing apparatus in accordance with a first embodiment of the present invention.

Figure 1:
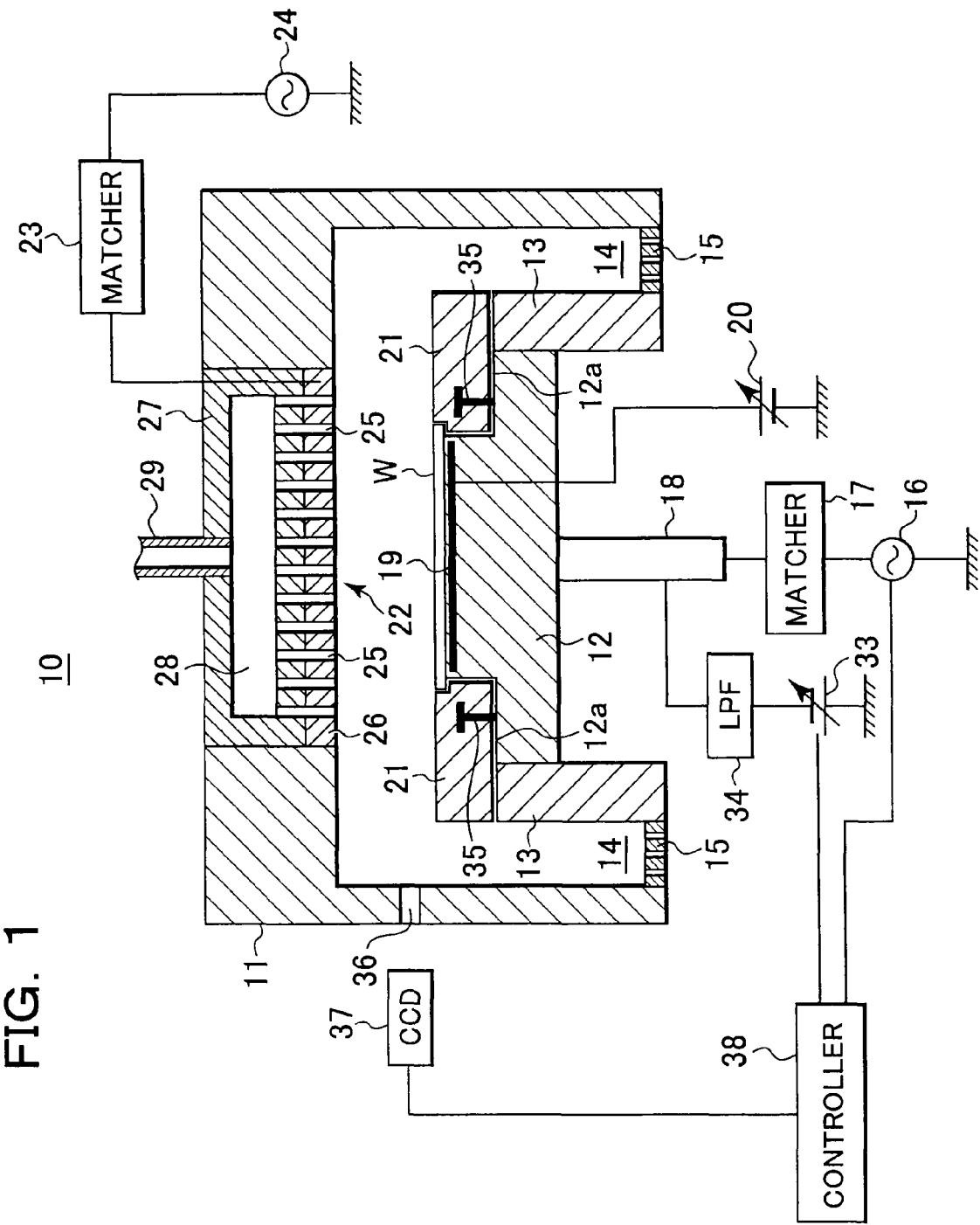
FIG. 1 is a cross-sectional view schematically illustrating the configuration of a plasma processing apparatus in accordance with a first embodiment of the present invention.

FIG. 1 is a cross-sectional view schematically illustrating the configuration of a plasma processing apparatus in accordance with a first embodiment of the present invention. This plasma processing apparatus is configured to perform an etching processing on a semiconductor wafer serving as a substrate.

In FIG. 1, a plasma processing apparatus 10 is provided with a chamber 11 (housing chamber) for housing semiconductor wafers (hereinafter simply referred to as "wafers") W having a diameter of, for example, 300 mm, and an electrostatic chuck 12 (mounting stage) to be mounted with a wafer W is disposed within the chamber 11. The electrostatic chuck 12 is formed of a lower disc-shaped member having a specific diameter on which there is placed an upper disc-shaped member having a diameter smaller than the diameter of the lower disc-shaped member. Note that the electrostatic chuck 12 is made of aluminum, and ceramic or the like is flame-sprayed onto the upper surface of the upper disc-shaped member. The wafer W is mounted on the upper disc-shaped member of the electrostatic chuck 12. The side surface of the electrostatic chuck 12 is covered with an insulator 13 which is a cylindrical member.

In addition, in the plasma processing apparatus 10, a lateral exhaust passage 14 functioning as a flow path for discharging a gas above the electrostatic chuck 12 out of the chamber 11 is formed by the insulator 13 and the inner wall of the chamber 11. An exhaust plate 15 is disposed midway along this lateral exhaust passage 14. The exhaust plate 15 is a plate-like member having a multitude of holes and prevents plasma from leaking from the lateral exhaust passage 14 to the downstream side thereof. In addition, a turbo molecular pump (TMP) or a dry pump (DP) (neither of which is shown in the figure) is connected through an exhaust port (not shown in the figure) on the downstream side of the exhaust plate 15. For the TMP and the like, the chamber 11 is depressurized into a high-vacuum state (for example, 133 Pa (1 Torr) or lower).

A lower high-frequency power source 16 (power supply unit) is connected to the electrostatic chuck 12 through a lower matching box (matcher) 17 and a power supply rod 18. The lower high-frequency power source 16 supplies high-frequency power to the electrostatic chuck 12. Consequently, the electrostatic chuck 12 functions as a lower electrode. In addition, the lower matching box 17 reduces the reflection of high-frequency power from the electrostatic chuck 12, thereby maximizing the efficiency of high-frequency power supply to the electrostatic chuck 12. Note that the power supply rod 18 is connected to the central part of the electrostatic chuck 12.

In addition, an electrostatic electrode plate 19 is buried in the upper disc-shaped member in the electrostatic chuck 12, and a DC power source for suction 20 is electrically connected to the electrostatic electrode plate 19. When a positive high DC voltage is applied to the electrostatic electrode plate 19, a negative potential is generated on a surface of a wafer W on the electrostatic chuck 12 side (hereinafter referred to as the "back side"). Consequently, there arises a potential difference between the electrostatic electrode plate 19 and the back side of the wafer W. The potential difference gives rise to a coulomb force or a Johnson-Rahbeck force, and the wafer W is sucked and held by the coulomb force or the like on the upper disc-shaped member of the electrostatic chuck 12.

In addition, an annular focus ring 21 (annular member) is arranged in a portion 12a on the upper surface of the lower disc-shaped member of the electrostatic chuck 12 not overlapped with the upper disc-shaped member. The focus ring 21 is made of, for example, silicon and surrounds a wafer W sucked and held on the upper disc-shaped member of the electrostatic chuck 12. The focus ring 21 converges plasma produced within the chamber 11 onto the surface of the wafer W to improve the efficiency of etching processing. In addition, the focus ring 21 keeps a potential difference between the focus ring 21 and the plasma the same as a potential difference between the wafer W and the plasma, thereby keeping level a sheath formed between the wafer W (or focus ring 21) and the plasma.

A gas introduction shower head 22 is disposed in the ceiling portion of the chamber 11, so as to face the electrostatic chuck 12. An upper high-frequency power source 24 is connected to the gas introduction shower head 22 through an upper portion matching box 23. Since the upper high-frequency power source 24 supplies high-frequency power to the gas introduction shower head 22, the gas introduction shower head 22 functions as an upper electrode. Note that the function of the upper matching box 23 is the same as the function of the lower matching box 17 described above.

The gas introduction shower head 22 is provided with a ceiling electrode plate 26 having a multitude of gas holes 25 and an electrode support 27 for attachably/detachably supporting the ceiling electrode plate 26. In addition, a buffer chamber 28 is provided within the electrode support 27 and a processing gas introduction pipe 29 is connected to this buffer chamber 28. The gas introduction shower head 22 feeds a processing gas supplied from the processing gas introduction pipe 29 to the buffer chamber 28 into the chamber 11 through the gas holes 25.

Within the chamber 11 of this plasma processing apparatus 10, high-density plasma is produced from the processing gas by supplying high-frequency power to the electrostatic chuck 12 and the gas introduction shower head 22 and applying a high-frequency voltage to the chamber 11. Thus, an etching processing is performed on the wafer W using ions and the like in the plasma.

Incidentally, the focus ring 21 becomes worn in the plasma processing apparatus 10 when the etching processing of the wafer W is repeated. The present inventor performed an etching processing on the wafer W by applying a negative DC voltage to this worn focus ring 21 and measured the etch rate of the wafer W. The results of this measurement are shown in FIG. 2 described below.

Figure 2:
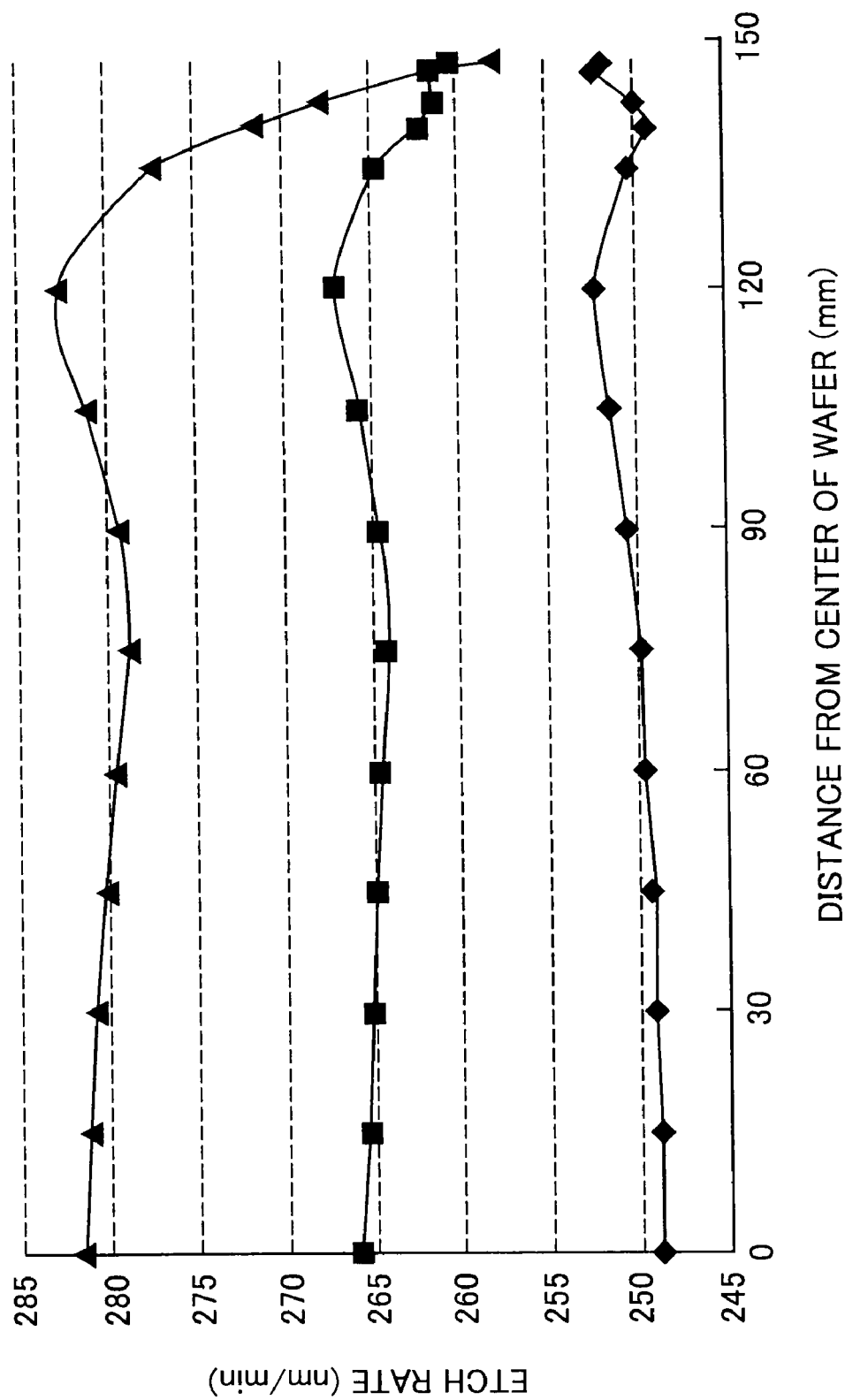
FIG. 2 is a graph showing an etch rate when a DC voltage is applied to a worn focus ring.

FIG. 2 is a graph showing an etch rate when a DC voltage is applied to the worn focus ring. In the graph shown in FIG. 2, the axis of ordinate represents an etch rate and the axis of abscissa represents a distance from the center of the wafer W. In addition, a symbol ♦ in the graph represents a case where no DC voltage was applied to the focus ring 21, a symbol ■ represents a case where a DC voltage of −1300 V was applied to the focus ring 21, and a symbol ▲ represents a case where a DC voltage of −1500 V was applied to the focus ring 21. Note that the amount of wear in the focus ring 21 used at this time was 1.2 mm with respect to the thickness direction thereof.

As shown in the graph of FIG. 2, it proved that the etch rate varied when the DC voltage applied to the focus ring 21 was changed. Consequently, it proved that the etch rate can be controlled by applying a DC voltage to the worn focus ring 21.

The reason that the etch rate varied when the applied DC voltage changed was assumed to be that a potential difference between the focus ring 21 and plasma facing the upper surface thereof varied and the plasma was displaced as the result of the DC voltage being applied to the focus ring 21, thereby changing the shape of a sheath around the peripheral part of the wafer W.

Figure 3:
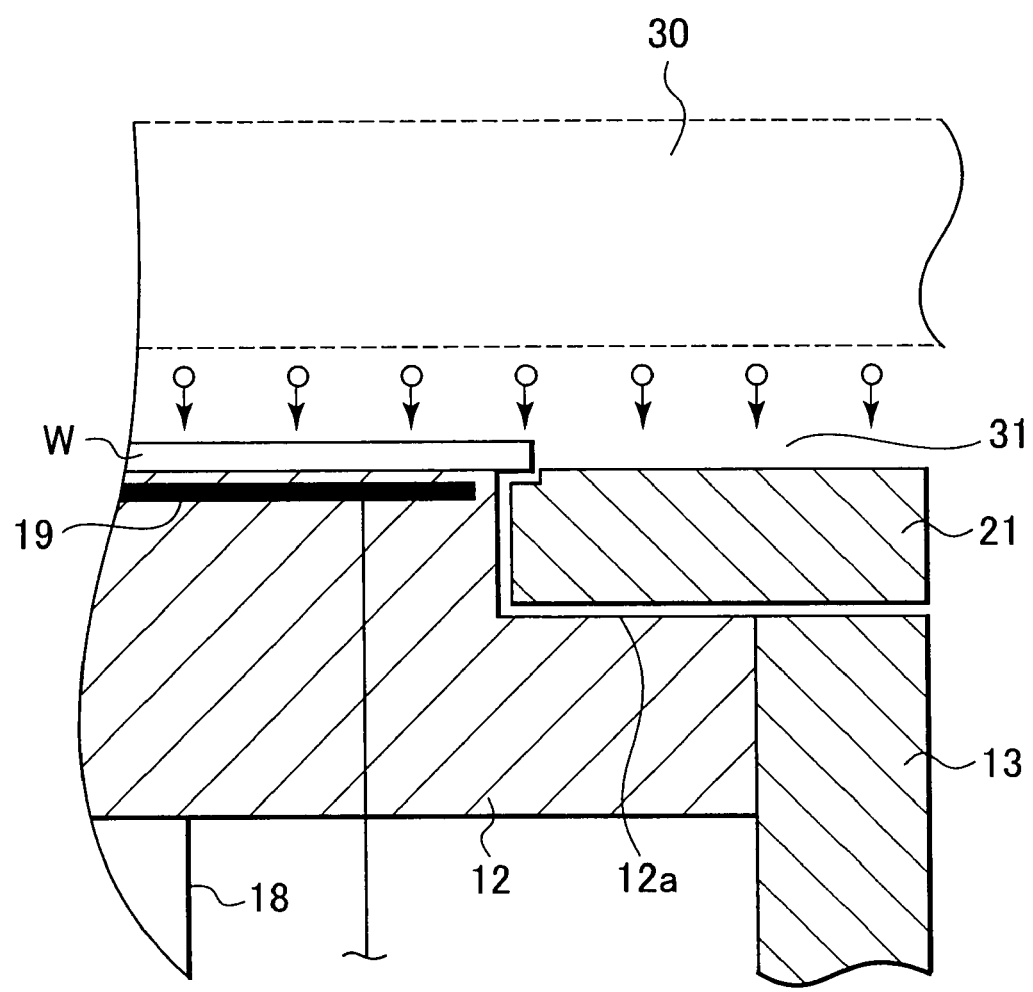
FIG. 3 is a schematic view illustrating plasma in a case where a DC voltage is applied to a worn focus ring.

In order to prove the above-described assumption, the present inventor once again applied a negative DC voltage to the worn focus ring 21, performed an etching processing on the wafer W, and observed plasma produced at this time using a CCD camera or the like. At this point, the present inventor confirmed that as shown in FIG. 3, plasma 30 facing the upper surface of the focus ring 21 was pushed up and the distance from the worn focus ring 21 to the plasma 30 increased. Consequently, the lower portion of the plasma 30 became level, i.e., the distribution of the plasma 30 became uniform. That is, the present inventor confirmed that when a DC voltage was applied to the focus ring 21, the plasma 30 facing the upper surface of the focus ring 21 was displaced and the shape of a sheath 31 varied around the peripheral part of the wafer W. In addition, it proved that a distortion in the sheath 31 was cancelled as the result of change in the shape thereof.

In addition, the present inventor measured the inclination of a trench formed when an etching processing was performed on the wafer W. The present inventor confirmed that when a negative DC voltage was applied to the worn focus ring 21 and the value of the negative DC voltage to be applied to the wafer W was increased, the inclination of the formed trench was cancelled and the angle of the trench approached 90°. Specifically, the present inventor confirmed that the angle of a formed trench was 86.5° when no DC voltage was applied to the worn focus ring 21, the angle was 88.3° when a DC voltage of −1470 V was applied to the focus ring 21, and the angle was 89.1° when a DC voltage of −1570 V was applied to the focus ring 21. The reason for this was assumed to be that as described above, the distortion of the sheath 31 was cancelled when a negative DC voltage was applied to the focus ring 21 and, consequently, ions 32 perpendicularly entered the wafer W across the entire surface thereof.

The present inventor also confirmed that when the absolute value of a negative DC voltage applied to the focus ring 21 was increased, an etch rate in the central part of the wafer W increased more than in the peripheral part thereof, as shown in the graph of FIG. 2. For this finding, the present inventor predicted the following mechanism.

That is, the plasma 30 facing the upper surface of the focus ring 21 is pushed up as the result of a negative DC voltage being applied to the focus ring 21, and the distance from the worn focus ring 21 to the plasma increases. If the distance increases, in general, a capacitance (C) between the focus ring 21 and the plasma decreases, making it difficult for a high-frequency current to pass therethrough. If it is difficult for the high-frequency to pass through above the focus ring 21, the high-frequency current intensively flows over the wafer W, thereby increasing the density of the plasma above the wafer W. As a result, the etch rate of the wafer W, particularly the etch rate in the central part thereof, increases.

Referring back to FIG. 1, the plasma processing apparatus 10 is provided with a DC power source for a focus ring 33 (voltage applying unit) connected to the power supply rod 18 through a lowpass filter 34, in order to apply a negative DC voltage to the focus ring 21. The DC power source for a focus ring 33 applies a negative DC voltage to the focus ring 21 through the lowpass filter 34, the power supply rod 18 and the electrostatic chuck 12. In addition, in the plasma processing apparatus 10, the focus ring 21 is fastened to the electrostatic chuck 12 with a plurality of conductive screws 35. Consequently, continuity between the electrostatic chuck 12 and the focus ring 21 is ensured.

The plasma processing apparatus 10 is further provided with a view port 36 made of quartz on the side wall of the chamber 11. The arrangement height of the view port 36 is the same as the height at which plasma is produced above a wafer W mounted on the electrostatic chuck 12. In addition, a CCD camera 37 (observation unit) is disposed on the other side of the chamber 11 of the view port 36 so as to face the view port 36. The CCD camera 37 is connected to a controller 38 (control unit) comprised of a computer, etc. This controller 38 is connected to a DC power source for a focus ring 33 and the DC power source for a focus ring 33 sets the value of a DC voltage to be applied to the focus ring 21, and the like.

In the plasma processing apparatus 10, the CCD camera 37 optically observes the thickness distribution of a sheath (plasma distribution) within the chamber 11 through the view port 36, converts the observation result into an electrical signal, and sends the electrical signal to the controller 38. Upon receipt of the electrical signal, the controller 38 determines, based on the electrical signal, whether or not the sheath thickness distribution is uniform, i.e., whether or not the sheath is distorted. If the sheath is distorted (i.e., the focus ring 21 is worn), the controller 38 sets the value of a DC voltage to be applied to the focus ring 21 according to the sheath's degree of distortion, so that a potential difference between the focus ring 21 and the plasma becomes larger. The DC power source for a focus ring 33 applies a DC voltage corresponding to the set value to the focus ring 21. Consequently, the potential difference between the focus ring 21 and the plasma becomes larger and the plasma is pushed up, thereby cancelling the sheath distortion. Note that in the plasma processing apparatus 10, the controller 38 has a database showing the relationship between the sheath's degree of distortion and the value of a DC voltage to be applied. Using the database, the controller 38 sets the DC voltage to be applied to the focus ring 21 to a value appropriate for cancelling the sheath distortion.

Also note that as described above, an etch rate increases at the central part of the wafer W when a negative DC voltage is applied to the focus ring 21. In response to this change, the value of high-frequency power to be supplied to the electrostatic chuck 12 is changed in the plasma processing apparatus 10 based on a plasma density above the central part of the wafer W. Specifically, the CCD camera 37 optically observes the thickness distribution of a sheath through the view port 36, converts the observation result into an electrical signal, and sends the electrical signal to the controller 38. Upon receipt of the electrical signal, the controller 38 calculates the plasma density above the central part of the wafer W based on the electrical signal.

According to the calculated plasma density, the controller 38 changes the value of high-frequency power to be supplied from the lower high-frequency power source 16 to the electrostatic chuck 12. Note here that a case where a plasma density is high above the central part of the wafer W corresponds to a case where an etch rate at the central part of the wafer W is high. In the present embodiment, the controller 38 decreases the value of high-frequency power to be supplied to the electrostatic chuck 12 if the plasma density is high. Since the power supply rod 18 is connected to the central part of the electrostatic chuck 12, a high-frequency current decreases at the central part of the electrostatic chuck 12, i.e., above the central part of the wafer W in particular, when the value of high-frequency power supplied to the electrostatic chuck 12 becomes smaller. This causes the plasma density to become lower. Consequently, it is possible to prevent an etch rate at the central part of the wafer W from becoming higher. Note that in the plasma processing apparatus 10, the controller 38 has a database showing the relationship between the plasma density and the value of high-frequency power to be supplied. Using the database, the controller 38 sets high-frequency power to be supplied to the electrostatic chuck 12 to a value appropriate for preventing an etch rate at the central part of the wafer W from becoming higher.

Next, an explanation will be made of a method of plasma distribution correction in accordance with the present invention.

Figure 4:
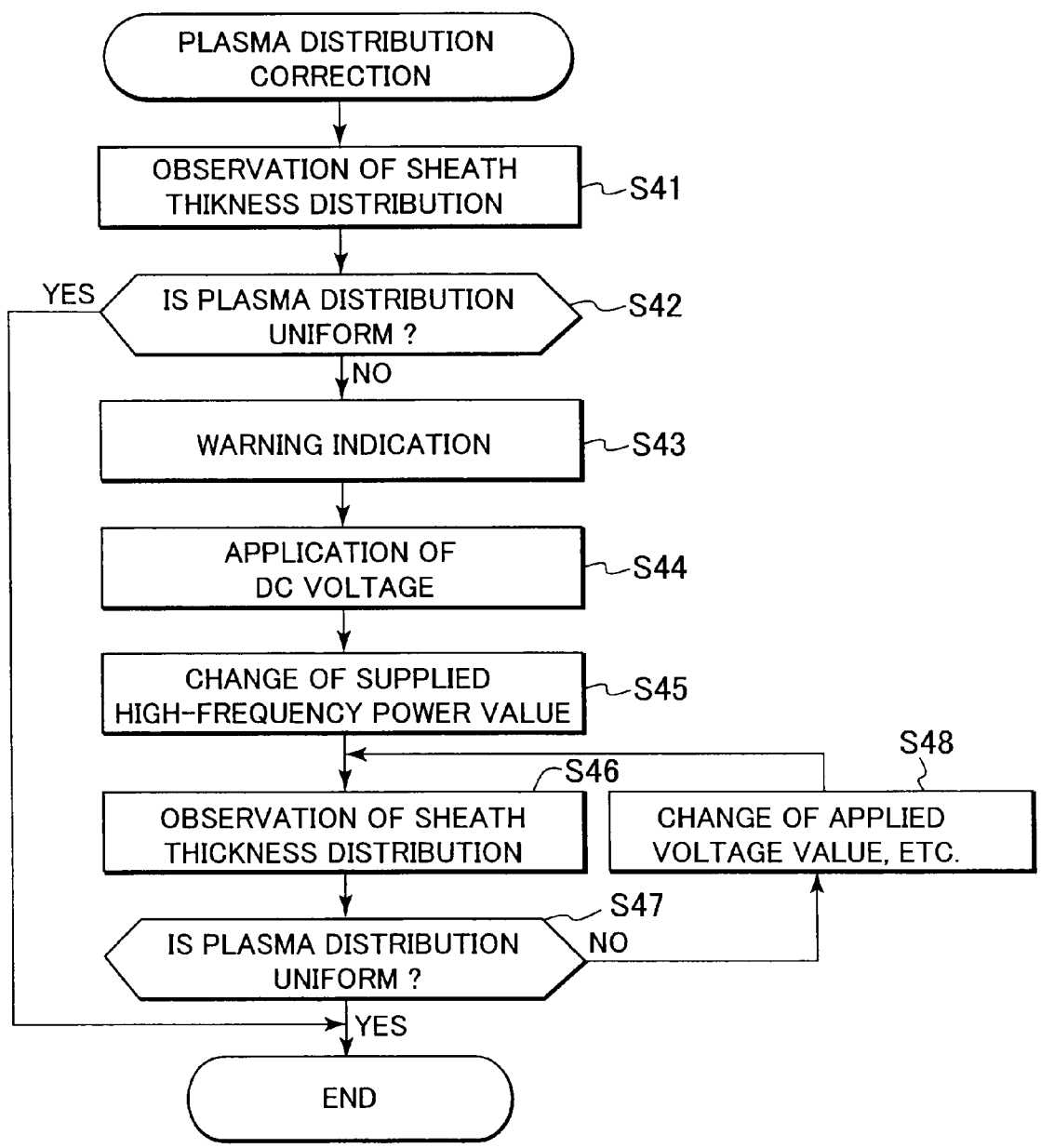
FIG. 4 is a flowchart of a method of plasma distribution correction in accordance with the present embodiment.

FIG. 4 is a flowchart of a method of plasma distribution correction in accordance with the present embodiment. The method of plasma distribution correction is carried out by the plasma processing apparatus 10.

In FIG. 4, first, the CCD camera 37 optically observes the thickness distribution of a sheath produced within the chamber 11 (step S41) when a wafer W is mounted on the electrostatic chuck 12 and an etching processing is performed on the wafer W, and then the controller 38 determines whether or not the plasma distribution is uniform based on the observation result (step S42).

If the plasma distribution proves uniform as the result of determination in step S42, the controller 38 terminates this processing and, if the plasma distribution is not uniform, the controller 38 indicates a warning to the effect that the plasma distribution is not uniform, on a display panel (not shown in the figure) provided in the plasma processing apparatus 10 (step S43). The controller 38 sets the value of a DC voltage to be applied to the focus ring 21 according to the sheath's degree of distortion. The DC power source for a focus ring 33 applies a DC voltage corresponding to the set value to the focus ring 21 (step S44).

Next, the CCD camera 37 optically observes the thickness distribution of the sheath, and the controller 38 calculates a plasma density above the central part of the wafer W based on the observation result and changes the value of high-frequency power to be supplied to the electrostatic chuck 12 according to the calculated plasma density (step S45).

Then, the CCD camera 37 optically observes the thickness distribution of the sheath (step S46) and the controller 38 determines whether or not the plasma distribution is uniform based on the observation result (step S47).

If the plasma distribution proves uniform as the result of determination in step S47, the controller 38 terminates this processing and, if the plasma distribution is not uniform, the controller 38 sets the value of a DC voltage to be applied to the focus ring 21 according to the sheath's degree of distortion (step S48) and returns to step S46.

According to the plasma processing apparatus 10 in accordance with the present embodiment, the thickness distribution of a sheath within the chamber 11 is optically observed, the value of a DC voltage to be applied to the focus ring 21 is set based on the observed sheath thickness distribution, i.e., the degree of sheath distortion, and a DC voltage corresponding to the set value is applied to the focus ring 21. When a negative DC voltage is applied to the focus ring 21, a potential difference between the focus ring 21 and plasma facing the upper surface thereof varies, thereby varying the distance from the focus ring 21 to the plasma. Consequently, it is possible to prevent the plasma from being displaced due to wear in the focus ring 21 and the sheath from becoming distorted. In addition, since the sheath can be prevented from becoming distorted simply by applying a DC voltage to the focus ring 21, it is possible to simplify the configuration of the plasma processing apparatus 10. Furthermore, since there is no need to move the focus ring 21, deposits do not separate therefrom. As a result, it is possible to prevent particles from attaching to the wafer W. Still furthermore, since a plasma distribution is optically observed using the CCD camera 37, it is possible to know the plasma distribution more precisely by measuring a pressure and a temperature within the chamber 11 than when the plasma distribution is observed indirectly. As a result, it is possible to make the value of a DC voltage to be applied even more appropriate.

Also in the plasma processing apparatus 10 described above, if the sheath is distorted, the value of a DC voltage to be applied is set so that a potential difference between the focus ring 21 and the plasma becomes larger. If the potential difference between the focus ring 21 and the plasma facing the upper surface thereof becomes larger, the distance from the focus ring 21 to the plasma increases, thereby allowing the plasma to be pushed up reliably. Consequently, it is possible to reliably prevent the plasma from lowering due to wear in the focus ring 21 and the sheath from becoming distorted.

Also in the plasma processing apparatus 10 described above, when a DC voltage is applied to the focus ring 21, the value of high-frequency power to be supplied to the electrostatic chuck 12 is changed according to the calculated plasma density above the central part of the wafer W. In particular, if the plasma density is high, the value of high-frequency power is decreased. Consequently, it is possible to reduce the plasma density above the central part of the wafer W, thereby preventing an etch rate at the central part of the wafer W from becoming higher.

In the above-described plasma processing apparatus 10, a DC voltage is applied to the focus ring 21 through a lowpass filter 34, a power supply rod 18 and an electrostatic chuck 12. That is, since a DC voltage can be applied to the focus ring 21 simply by connecting the DC power source for a focus ring 33 to the power supply rod 18, it is possible to make the configuration of the plasma processing apparatus 10 even simpler.

Figure 5:
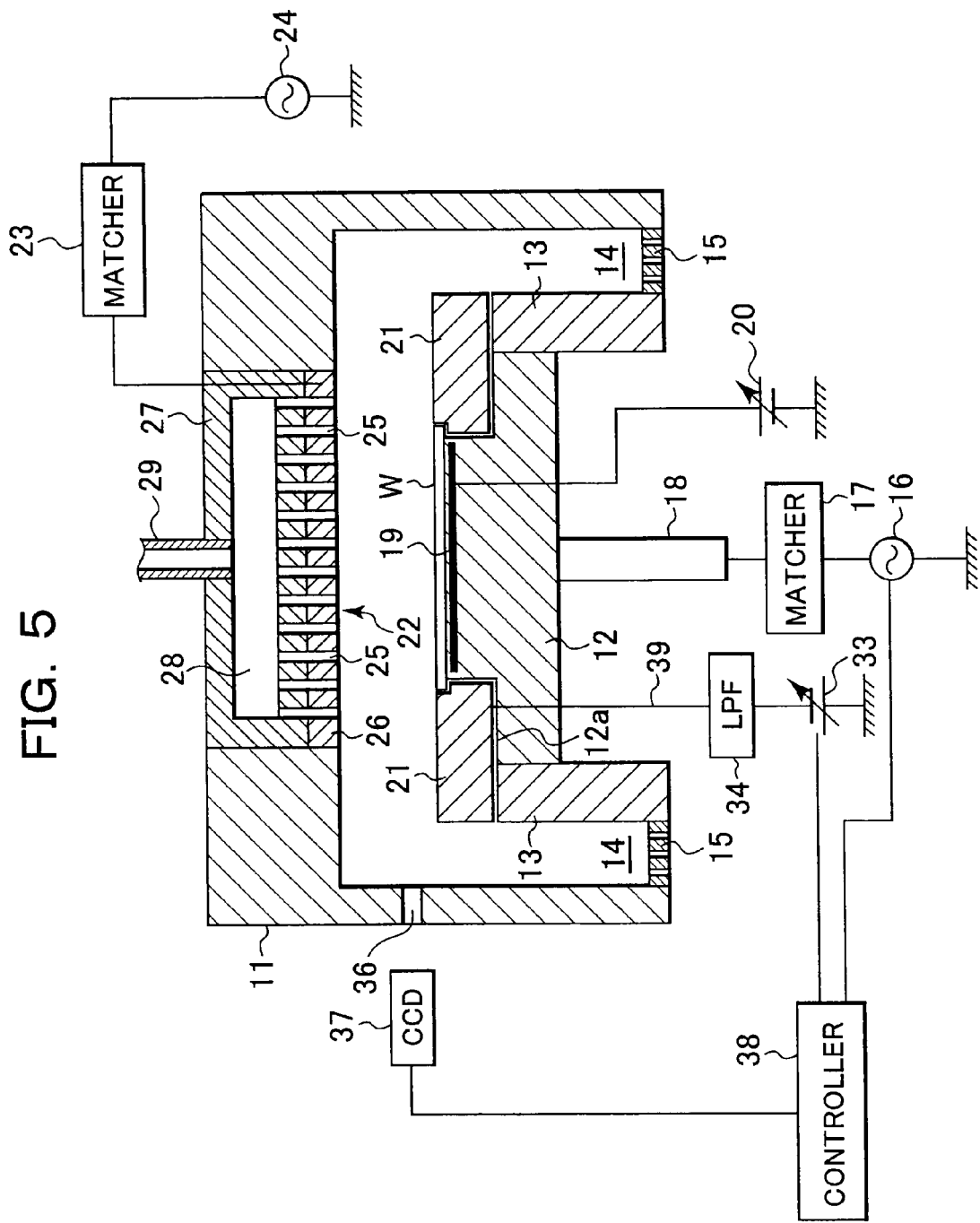
FIG. 5 is a cross-sectional view schematically illustrating the configuration of a modification example of the plasma processing apparatus shown in FIG. 1.

Although in the above-described plasma processing apparatus 10, a DC voltage is applied to the focus ring 21 through the power supply rod 18 and the electrostatic chuck 12, a method of applying a DC voltage to the focus ring 21 is not limited thereto. For example, the DC power source for a focus ring 33 may be connected to the focus ring 21 through the lowpass filter 34 using a conductive wire 39, as shown in FIG. 5. Consequently, it is possible to reliably apply a DC voltage to the focus ring 21. In addition, it is possible to eliminate the need for providing the conductive screws 35. Furthermore, since the DC voltage for the focus ring 21 is not applied to any other components of the plasma processing apparatus 10, specifically the power supply rod 18 and the electrostatic chuck 12, it is possible to eliminate the possibility of the DC voltage exerting an adverse effect on etching processing.

Next, an explanation will be made of a plasma processing apparatus in accordance with a second embodiment of the present invention.

The present embodiment is basically the same in configuration and effect as the above-described first embodiment and only differs in the way the amount of wear in a focus ring is measured. The same parts of configuration and effect, therefore, will not be explained further and only the different parts thereof will be explained hereinafter.

Figure 6:
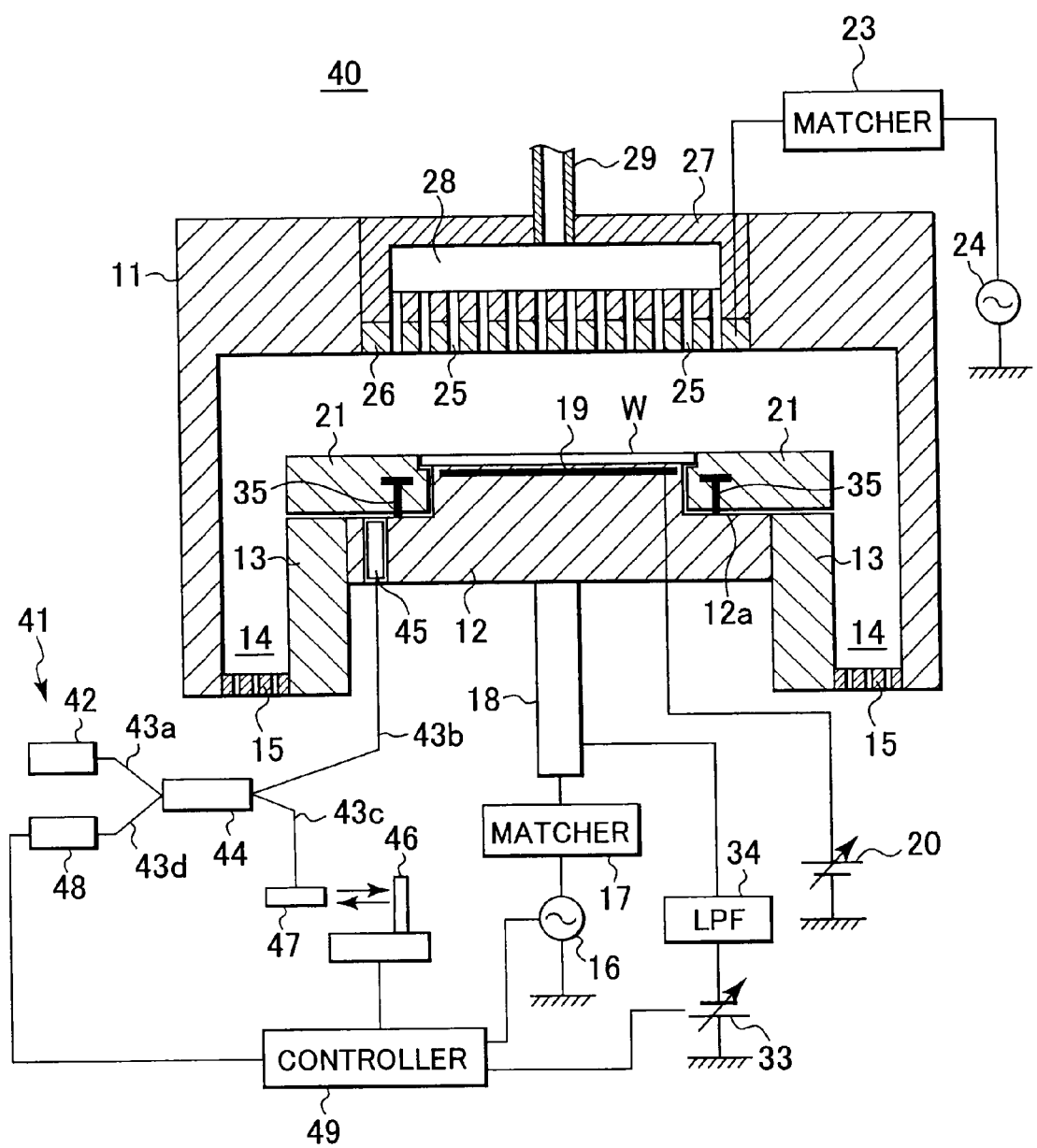
FIG. 6 is a cross-sectional view schematically illustrating the configuration of a plasma processing apparatus in accordance with a second embodiment of the present invention.

FIG. 6 is a cross-sectional view schematically illustrating the configuration of a plasma processing apparatus in accordance with the present embodiment.

In FIG. 6, a plasma processing apparatus 40 is provided with a focus ring wear measurement unit 41. The focus ring wear measurement unit 41 is provided with a laser light oscillator 42 for irradiating infrared low-coherent light as laser light (for example, SLD having a wavelength of 1300 nm), a 2×2 coupler 44 connected through the laser light oscillator 42 and an optical fiber 43a, a collimator 45 connected through the 2×2 coupler 44 and an optical fiber 43b and is disposed so as to face the lower surface of a focus ring 21 within an electrostatic chuck 12, a collimator 47 connected through the 2×2 coupler 44 and an optical fiber 43c and is disposed so as to face a mobile reference mirror 46, and a detector 48 connected through the 2×2 coupler 44 and an optical fiber 43d. In addition, the optical fibers 43a and 43d are connected to one end of the 2×2 coupler 44 and the optical fibers 43b and 43c are connected to the other end thereof.

In the focus ring wear measurement unit 41, the laser light oscillator 42 emits laser light, the 2×2 coupler 44 transfers the laser light to the collimators 45 and 47, respectively, the collimator 45 irradiates the transferred laser light at the lower surface of the focus ring 21, and the collimator 47 irradiates the transferred laser light at the reference mirror 46.

Part of the laser light irradiated from the collimator 45 reflects off the lower surface of the focus ring 21, and the rest of the laser light enters the focus ring 21 and reflects off the upper surface of the focus ring 21. The laser light reflected off the lower and upper surfaces of the focus ring 21 (catoptric laser light) enters the collimator 45 and is transferred to the 2×2 coupler 44. In addition, the laser light irradiated from the collimator 47 is reflected by the reference mirror 46. The reflected laser light (catoptric laser light) enters the collimator 47 and is transferred to the 2×2 coupler 44. Each catoptric laser light transferred to the 2×2 coupler 44 is transferred to the detector 48.

When the laser light oscillator 42 emits laser light, the reference mirror 46 moves in parallel with laser light irradiated from the collimator 47. Accordingly, a change takes place in the optical path length of catoptric laser light from the reference mirror 46 to be transferred to the detector 48. At this time, if the optical path length of catoptric laser light from the reference mirror 46 coincides with the optical path length of catoptric laser light from the focus ring 21, an interference occurs. The detector 48 detects the occurrence of the interference.

Since there are two types of catoptric laser light reflected from the focus ring 21, one reflected by the lower surface of the focus ring 21 and the other reflected by the upper surface thereof, the interference occurs twice. Since the respective interferences correspond to the upper surface and the lower surface positions of the focus ring 21, a distance traveled by the reference mirror 46 during the two rounds of interference corresponds to a distance between the upper and lower surfaces of the focus ring 21, i.e., the thickness of the focus ring 21. In addition, the travel distance of the reference mirror 46 corresponds to a difference in the optical path length of laser light in the atmosphere, whereas the distance between the upper and lower surfaces of the focus ring 21 corresponds to a difference in the optical path length of laser light within the focus ring 21. Consequently, it is possible to calculate the thickness of the focus ring 21 by dividing the travel distance of the reference mirror 46 by the refractive index of the focus ring 21. Note that the present inventor et al. have already confirmed that a wear measurement unit using infrared low-coherent light as laser light like the focus ring wear measurement unit 41 can measure an amount of wear of 3 μm per unit time when measuring the amount of wear in a focus ring, and has extremely high measurement accuracy.

In the plasma processing apparatus 40, the detector 48 is connected to a controller 49 (controlling unit) comprised of a computer, etc. Upon detection of interferences between catoptric laser light from the reference mirror 46 and catoptric laser light from the focus ring 21, the detector 48 transmits the timings of detection to the controller 49. The controller 49 calculates the travel distance of the reference mirror 46 based on the respective transmitted timings, additionally the thickness of the focus ring 21 based on the refractive index thereof, and eventually the amount of wear in the focus ring 21. Note that since the refractive index of the focus ring 21 varies depending on the temperature thereof, the controller 49 has a database showing the relationship between the temperature and the refractive index of the focus ring 21 and calculates the amount of wear in the focus ring 21 using the database.

In addition, the controller 49 sets the value of a DC voltage to be applied to the focus ring 21 based on the calculated amount of wear in the focus ring 21, so as to increase the potential difference between the focus ring 21 and plasma. The DC power source for a focus ring 33 applies a DC voltage corresponding to the set value to the focus ring 21. Consequently, the potential difference between the focus ring 21 and the plasma becomes larger and the plasma is pushed up, thereby cancelling a sheath distortion. Note that in the plasma processing apparatus 40, the controller 49 has a database showing the relationship between the amount of wear in the focus ring 21 and the value of a DC voltage to be applied. Using the database, the controller 49 sets the DC voltage to be applied to the focus ring 21 to a value appropriate for cancelling the sheath distortion.

As described above, since an etch rate at the central part of a wafer W increases when a negative DC voltage is applied to the focus ring 21, the controller 49 changes the value of high-frequency power supplied from the lower high-frequency power source 16 to the electrostatic chuck 12 based on the calculated amount of wear in the focus ring 21. Consequently, it is possible to prevent the etch rate at the central part of the wafer W from becoming higher. Note that in the plasma processing apparatus 40, the controller 49 has a database showing the relationship between the amount of wear in the focus ring 21 and the value of high-frequency power to be supplied. Using the database, the controller 49 sets the value of high-frequency power to be supplied to the electrostatic chuck 12 to a value appropriate for preventing the etch rate at the central part of the wafer W from becoming higher.

Next, an explanation will be made of a method of plasma distribution correction in accordance with the present embodiment.

Figure 7:
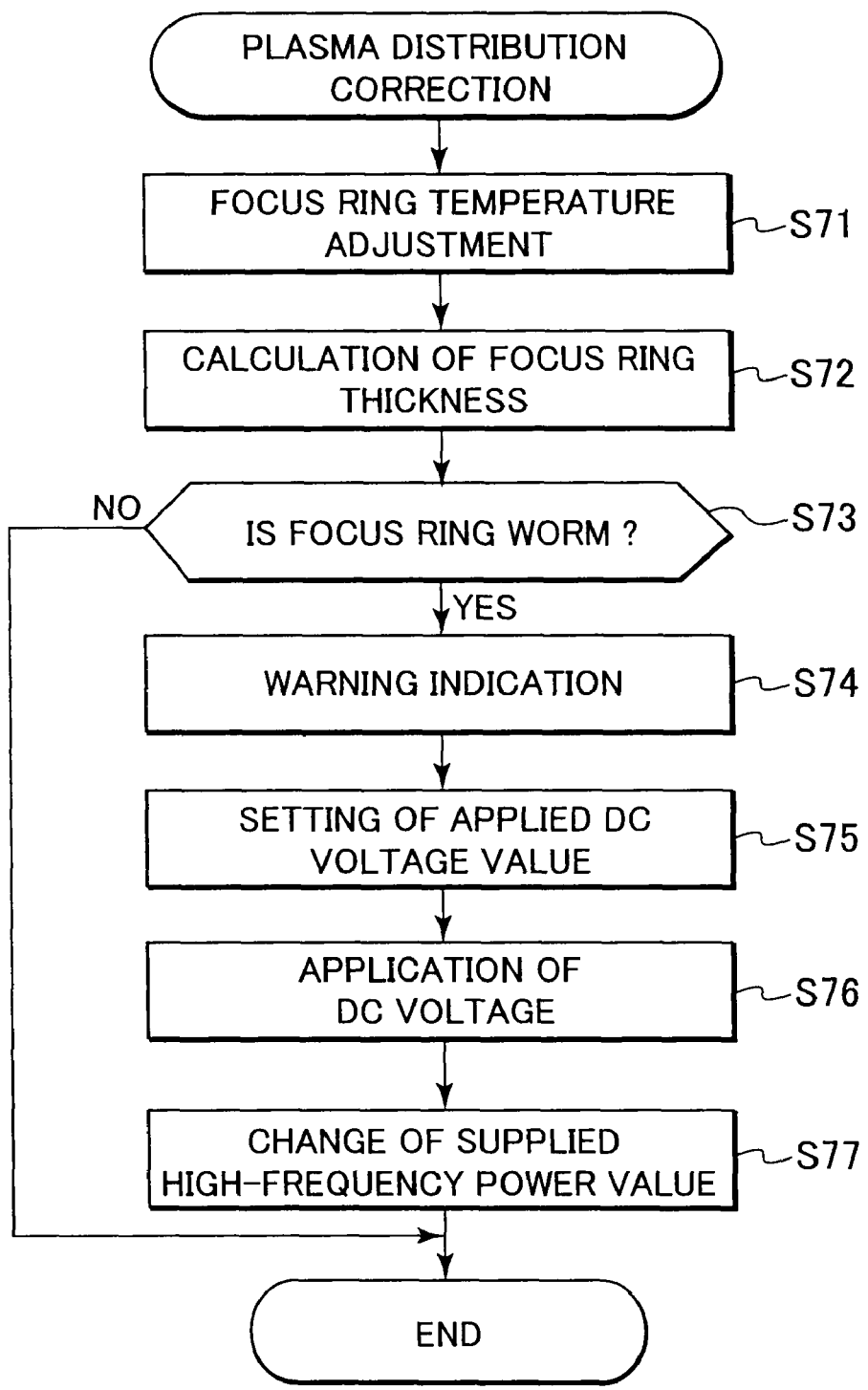
FIG. 7 is a flowchart of a method of plasma distribution correction in accordance with the present embodiment.

FIG. 7 is a flowchart of the method of plasma distribution correction in accordance with the present embodiment. The method of plasma distribution correction is carried out by the plasma processing apparatus 40.

In FIG. 7, first, a nitrogen gas or the like is flowed into the chamber 11 to raise the pressure thereof up to a predetermined value. At this time, heat transfer between the electrostatic chuck 12, the temperature of which is adjusted to a steady value by an unillustrated temperature adjustment mechanism, and the focus ring 21 is improved by the nitrogen gas or the like. The temperature of the focus ring 21 is consequently also adjusted to a steady value (step S71).

Then, the controller 49 calculates the thickness (amount of wear) of the focus ring 21 based on the result of measurement of catoptric laser light by the focus ring wear measurement unit 41 and on the temperature of the focus ring 21 adjusted to a steady value (step S72), and determines whether or not the focus ring 21 is worn (step S73) based on the measurement result.

If the focus ring 21 proves not worn as the result of determination in step S73, the controller 49 terminates this processing. If the focus ring 21 proves worn, the controller 49 indicates a warning to the effect that the focus ring 21 is worn, on a display panel (not shown in the figure) provided in the plasma processing apparatus 40 (step S74). The controller 49 sets the value of a DC voltage to be applied to the focus ring 21 based on the calculated amount of wear in the focus ring 21 (step S75). The DC power source for a focus ring 33 applies a DC voltage corresponding to the set value to the focus ring 21 (step S76).

Then, the controller 49 changes the value of high-frequency power to be supplied from the lower high-frequency power source 16 to the electrostatic chuck 12 based on the calculated amount of wear in the focus ring 21 (step S77), and terminates this processing.

According to the plasma processing apparatus 40 in accordance with the present invention, the amount of wear in the focus ring 21 is calculated based on catoptric laser light from the focus ring 21, the value of a DC voltage to be applied to the focus ring 21 is set based on the calculated amount of wear in the focus ring 21, and a DC voltage corresponding to the set value is applied to the focus ring 21. Consequently, it is possible to prevent a sheath from becoming distorted. In addition, since the amount of wear in the focus ring 21 is calculated based on the catoptric laser light, there is no need to bring a probe into contact with the focus ring 21 to measure the amount of wear. That is, it is possible to eliminate the need to stop the operation of the plasma processing apparatus 40 in order to bring the probe into the chamber 11, thereby improving the operating rate of the plasma processing apparatus 40.

In the above-described plasma processing apparatus 40, the temperature of the focus ring 21 is controlled to a steady value prior to calculating the amount of wear in the focus ring 21. When calculating the amount of wear in the focus ring 21 based on catoptric laser light, the amount of wear is calculated based on a difference in the optical path length of the catoptric laser light in the focus ring 21. However, this optical path length difference varies according to the temperature of the focus ring 21. Consequently, it is possible to identify a difference in the optical path length of catoptric laser light in the focus ring 21 by controlling the temperature of the focus ring 21 to a steady value, thereby precisely calculating the amount of wear in the focus ring 21.

Note that in the above-described plasma processing apparatus 40, laser light is irradiated at the lower surface of the focus ring 21. Alternatively, the laser light may be irradiated at the upper surface of the focus ring 21. In this case, the laser light may be irradiated from the shower head 22 side. Yet alternatively, the laser light may be irradiated from the side wall side of the chamber 11 and the traveling direction of the laser light may be bent toward the focus ring 21 by a prism or the like.

Next, an explanation will be made of a plasma processing apparatus in accordance with a third embodiment of the present invention.

The present embodiment is basically the same in configuration and effect as the above-described first embodiment and only differs in the way the amount of wear in a focus ring is predicted. The same parts of configuration and effect, therefore, will not be explained further and only the different parts thereof will be explained hereinafter.

Figure 8:
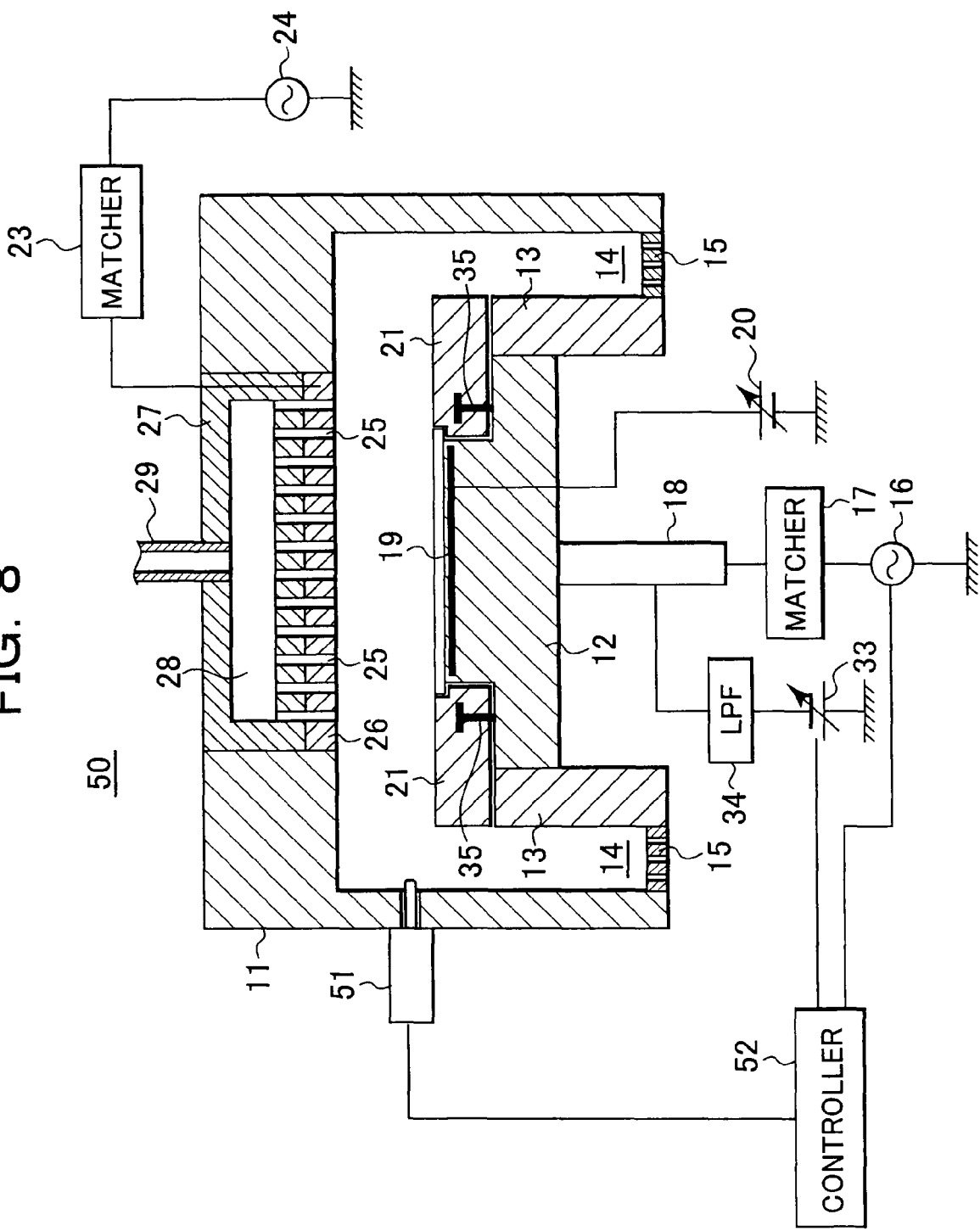
FIG. 8 is a cross-sectional view schematically illustrating the configuration of a plasma processing apparatus in accordance with a third embodiment of the present invention.

FIG. 8 is a cross-sectional view schematically illustrating the configuration of a plasma processing apparatus in accordance with the present embodiment.

In FIG. 8, a plasma processing apparatus 50 is provided with a sensor 51 provided on the side wall of a chamber 11 and a controller 52 (control unit) connected to the sensor 51. The sensor 51 measures a pressure and a temperature (plasma processing conditions) within the chamber 11 and transmits the result of measurement to the controller 52.

Figure 9A:
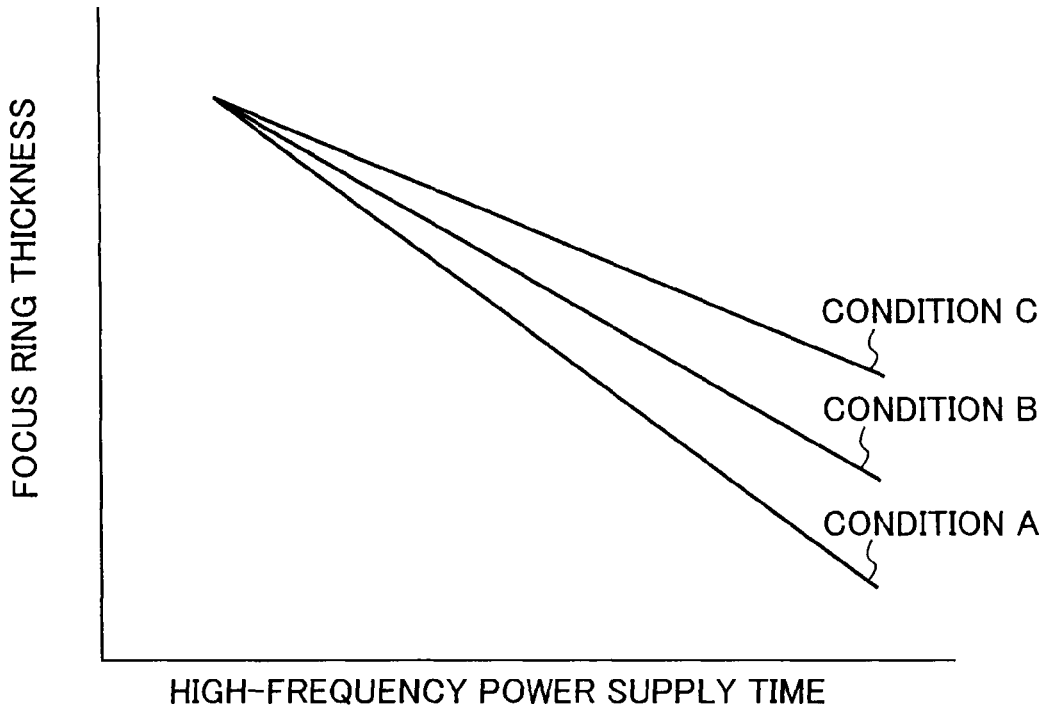
Figure 9B:
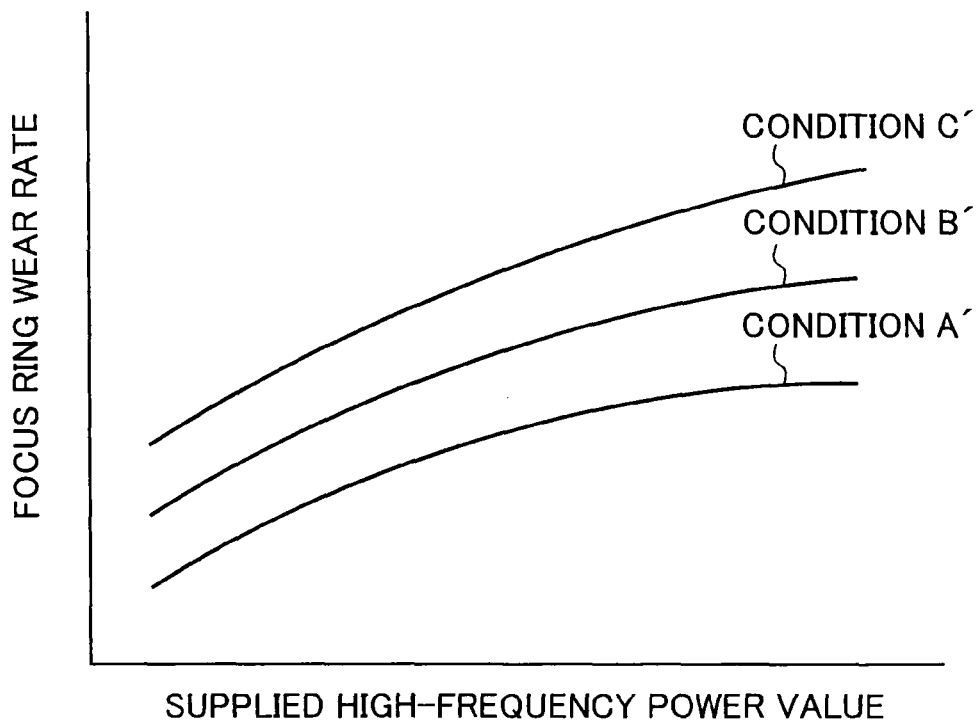

The controller 52 is also connected to a lower high-frequency power source 16 to monitor the supplied value and supply time (plasma processing execution time) of high-frequency power supplied to the electrostatic chuck 12. In addition, the controller 52 stores a database showing the relationship between the supply time of high-frequency power and the thickness of the focus ring 21 (FIG. 9) and a database showing the relationship between the supplied value of high-frequency power and the wear rate of the focus ring 21 (FIG. 9). In these databases, there are previously defined the relationship between the supply time of high-frequency power and the thickness of the focus ring 21 and the relationship between the supplied value of high-frequency power and the wear rate of the focus ring 21 for every etching condition in which a pressure and a temperature within the chamber 11 and, additionally, the supplied value of high-frequency power differ (conditions A to C and conditions A' to C').

In this plasma processing apparatus 50, the controller 52 predicts the thickness and the wear rate of the focus ring 21 based on the supply time and the supplied value of high-frequency power and, additionally, a pressure and a temperature within the chamber 11, using the above-described databases, and predicts the amount of wear in the focus ring 21 from the thickness and the wear rate.

In addition, the controller 52 is the same as the controller 49 in the second embodiment in that the controller 52 sets the value of a DC voltage to be applied to the focus ring 21 based on the predicted amount of wear in the focus ring 21 and changes the value of high-frequency power to be supplied from the lower high-frequency power source 16 to the electrostatic chuck 12 also based on the predicted amount of wear in the focus ring 21.

Next, an explanation will be made of a method of plasma distribution correction in accordance with the present embodiment.

Figure 10:
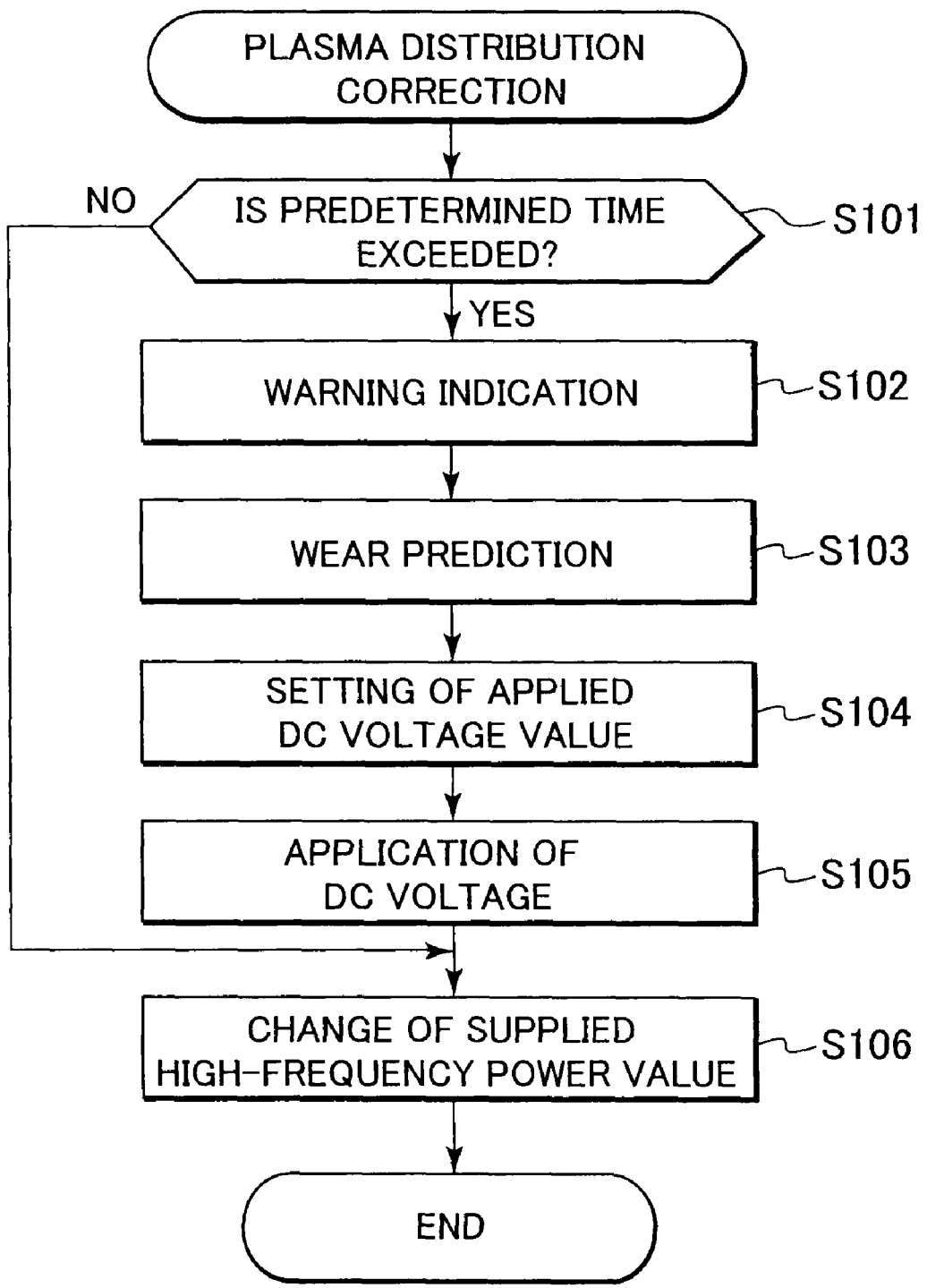
FIG. 10 is a flowchart of a method of plasma distribution correction in accordance with the present embodiment.
Figure 11A:
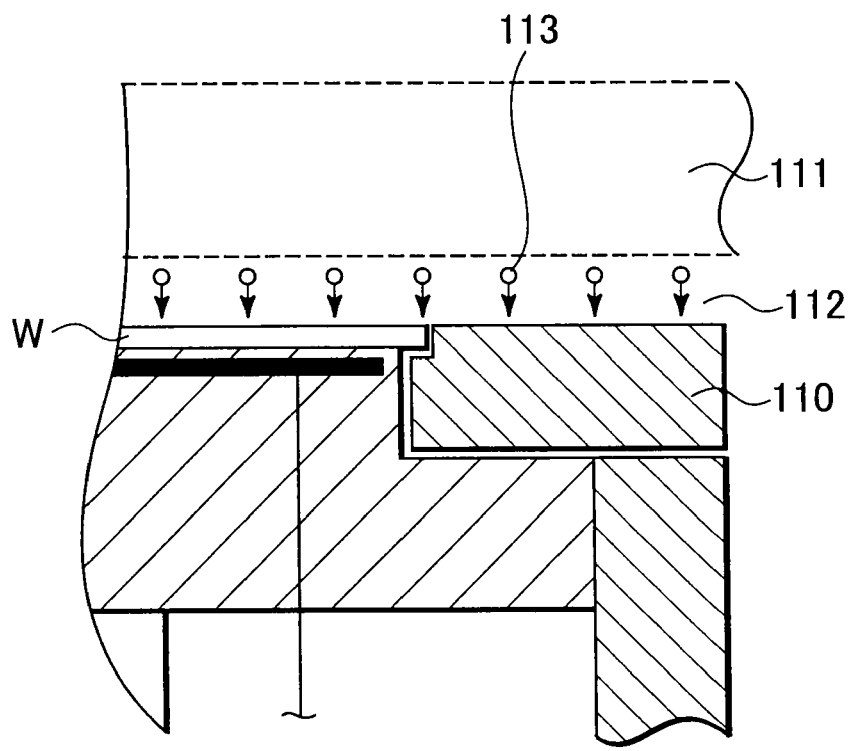
Figure 11B:
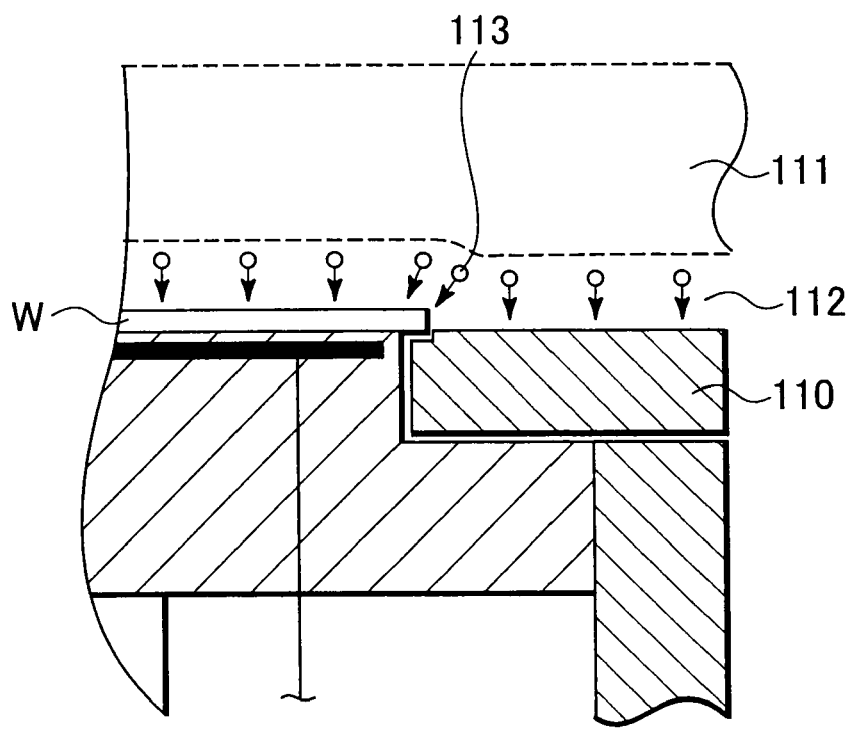

FIG. 10 is a flowchart of a method of plasma distribution correction in accordance with the present embodiment. The method of plasma distribution correction is carried out by the plasma processing apparatus 50.

In FIG. 10, the controller 52 monitors the supply time of high-frequency power supplied to the electrostatic chuck 12, and determines whether or not the supply time has exceeded a predetermined time, for example, a time corresponding to a time over which the amount of wear in the focus ring 21 exceeds a predetermined amount (step S101).

If the supply time of high-frequency power has not yet exceeded the predetermined time as the result of determination in step S101, the controller 52 terminates this processing. If the supply time of high-frequency power has exceeded the predetermined time, the controller 52 indicates a warning to the effect that the focus ring 21 is worn, on a display panel (not shown in the figure) provided in the plasma processing apparatus 50 (step S102).

Then, the controller 52 predicts the amount of wear in the focus ring 21 based on the supply time and the supplied value of high-frequency power and, additionally, on a pressure and a temperature within the chamber 11 using the above-described databases (step S103), and sets the value of a DC voltage to be applied to the focus ring 21 based on the predicted amount of wear in the focus ring 21 (step S104). The DC power source for a focus ring 33 applies a DC voltage corresponding to the set value to the focus ring 21 (step S105).

Next, the controller 52 changes the value of high-frequency power to be supplied from the lower high-frequency power source 16 to the electrostatic chuck 12 (step S106) based on the predicted amount of wear in the focus ring 21, and terminates this processing.

According to the plasma processing apparatus 50 in accordance with the present embodiment, the amount of wear in the focus ring 21 is predicted based on the pressure and temperature within the chamber 11 and on the supply time and the supplied value of high-frequency power, the value of a DC voltage to be applied to the focus ring 21 is set based on the predicted amount of wear in the focus ring 21, and a DC voltage corresponding to the set value is applied to the focus ring 21. Consequently, it is possible to prevent a sheath from becoming distorted. In addition, since the amount of wear in the focus ring 21 is predicted based on the pressure and the temperature within the chamber 11 and on the supply time and supplied value of high-frequency power, there is no need for a CCD camera and a probe for measuring the amount of wear. This means that there is, at worst, only the need for a sensor 51. Accordingly, it is possible to further simplify the configuration of the plasma processing apparatus 50.

Note that although in the above-described respective embodiments, the substrate is specified as a semiconductor wafer W, the substrate is not limited thereto. The substrate may be, for example, a glass substrate such as a liquid crystal display (LCD) or a flat panel display (FPD).

The Objects of the present invention can also be achieved by providing a storage medium, in which the program code of software for realizing the functions of the above-described respective embodiments is recorded, to a computer so that the program code stored in the storage medium is read and executed by the CPU of the computer.

In this case, the program code itself read from the storage medium realizes the functions of the above-described respective embodiments, and the program code and the storage medium storing the program code constitute the present invention.

In addition, as a storage medium for supplying a program code, there may be used, for example, a RAM, an NV-RAM, a floppy disk (registered trademark), a hard disk, an magnetooptic disk, an optical disk, such as a CD-ROM, CD-R, CD-RW, DVD (DVD-ROM, DVD-RAM, DVD-RW and DVD+RW), a magnetic tape, a nonvolatile memory card, or any other type of ROM which can store the above-mentioned program code. Alternatively, the program code may be downloaded from unillustrated another computer and database connected to the Internet, a commercial network, a local-area network or the like, and supplied to the computer.

In addition, the achievement of the objects includes not only a case where the functions of the above-described respective embodiments are realized by executing the program code read from the computer but also a case where an operating system (OS) or the like running on the CPU performs part or whole of actual processing based on instructions given by the program code, and the functions of the above-described respective embodiments are realized by that processing.

Furthermore, the achievement of the objects includes a case where after the program code read from the storage medium is written to a memory provided in a function extension board inserted in the computer or a function extension unit connected thereto, a CPU or the like provided in the function extension board or the function extension unit performs part or whole of actual processing based on instructions given by the program code, and the functions of the above-described respective embodiments are realized by that processing.

The above-described program code may be composed of, for example, a program code to be executed by an object code or an interpreter or of script data supplied to the OS.

What is claimed is:

1. A plasma processing apparatus provided with a housing chamber adapted to house a substrate; a mounting stage disposed within said housing chamber and mounted with said substrate; an annular member disposed in said mounting stage so as to surround the periphery of said mounted substrate; and a power supply unit adapted to supply high-frequency power to said mounting stage; and configured to perform a plasma processing on said substrate using plasma produced within said housing chamber, said plasma processing apparatus comprising:

an observation unit adapted to optically observe the plasma sheath distorted over the annular member;

a voltage applying unit adapted to apply a negative DC voltage to said annular member; and a control unit adapted to cause said voltage applying unit to apply said negative DC voltage to said annular member so as to remove distortion of sheath over the substrate and annular member, the control unit adapted further to lower the value of high-frequency power to be supplied to said mounting stage which is a member other than said annular member on the basis of observed sheath thickness after application of negative DC voltage to the annular part, wherein said voltage applying unit includes a screw member connecting said annular member and said mounting stage and applies said negative DC voltage to said annular member through said mounting stage and said screw member.

2. The plasma processing apparatus according to claim 1, wherein said control unit sets the value of said negative DC voltage to be applied, so as to increase a potential difference between said annular member and said plasma.

3. The plasma processing apparatus according to claim 1, wherein said power supply unit is connected to said mounting stage through a power supply rod and said voltage applying unit applies said negative DC voltage to said annular member through said power supply rod and said mounting stage.

4. The plasma processing apparatus according to claim 1, wherein said voltage applying unit includes a conductive wire in contact with said annular member and applies said negative DC voltage to said annular member through said conductive wire.

5. The plasma processing apparatus according to claim 1, wherein said observation unit is a CCD camera.

* * * * *